(12) United States Patent
Hartmann et al.

(10) Patent No.: US 12,034,439 B2
(45) Date of Patent: Jul. 9, 2024

(54) SAFETY DEVICE, VALVE ARRANGEMENT AND METHOD

(71) Applicant: Festo SE & Co. KG, Esslingen (DE)

(72) Inventors: Philippus Hartmann, Wildberg (DE); Michael Schultheiß, Rudersberg (DE)

(73) Assignee: Festo SE & Co. KG, Esslingen (DE)

( * ) Notice: Subject to any disclaimer, the term of this patent is extended or adjusted under 35 U.S.C. 154(b) by 585 days.

(21) Appl. No.: 17/307,485

(22) Filed: May 4, 2021

(65) Prior Publication Data

US 2022/0069820 A1 Mar. 3, 2022

(30) Foreign Application Priority Data

Aug. 28, 2020 (DE) .......................... 102020210899.4

(51) Int. Cl.
*H03K 19/003* (2006.01)
(52) U.S. Cl.
CPC .................................. *H03K 19/003* (2013.01)
(58) Field of Classification Search
CPC .... H03K 19/003; F16K 31/02; F16K 37/0025
USPC .......................................................... 361/18
See application file for complete search history.

(56) References Cited

U.S. PATENT DOCUMENTS

| 5,724,223 | A | * | 3/1998 | Feuser | ................. | H01H 47/325 |
| | | | | | | 361/152 |
| 5,790,354 | A | * | 8/1998 | Altiti | ..................... | H01H 9/542 |
| | | | | | | 361/13 |
| 6,404,609 | B1 | * | 6/2002 | Mansfield | ............ | H04B 10/802 |
| | | | | | | 361/103 |
| 6,621,668 | B1 | * | 9/2003 | Sare | ........................ | H01H 9/542 |
| | | | | | | 361/13 |
| 2007/0008745 | A1 | * | 1/2007 | Joshi | ................. | H02M 3/33515 |
| | | | | | | 363/21.01 |

(Continued)

FOREIGN PATENT DOCUMENTS

| CN | 110206719 A | * | 9/2019 | .............. F04B 43/04 |
| EP | 1128711 A2 | * | 8/2001 | ......... H05B 41/3921 |

(Continued)

OTHER PUBLICATIONS

Gelbein Lawrence; Publication Date: Mar. 28, 2002; WO 0225612; Page-based gas valve controller; entire specification and drawings (Year: 2002).*

(Continued)

*Primary Examiner* — Dharti H Patel
(74) *Attorney, Agent, or Firm* — Hoffmann & Baron, LLP (57) ABSTRACT

A safety device (10, 30, 40, 50), in particular a safety control apparatus and/or a safety diagnosis apparatus, for industrial automation, including a logic voltage zone (4), a load voltage zone (5) which is galvanically separated from the logic voltage zone (4), a transmission unit (6) for transmitting a communication signal between the logic voltage zone (4) and the load voltage zone (5) whilst maintaining the galvanic separation, a first voltage supply connection (7) for providing a first supply voltage (V1) for the logic voltage zone (4) and a first current limitation element (8), wherein the transmission unit (6) is connected on the first voltage supply connection (7) via the first current limitation element (8) and is fed from the first voltage supply connection (7) via the first current limitation element (8).

17 Claims, 4 Drawing Sheets

(56) References Cited

U.S. PATENT DOCUMENTS

| | | | | |
|---|---|---|---|---|
| 2011/0204820 A1* | 8/2011 | Tikkanen | ............... | H05B 45/37 |
| | | | | 361/709 |
| 2011/0299212 A1* | 12/2011 | Kuo | ....................... | H01H 51/30 |
| | | | | 361/160 |
| 2013/0021062 A1* | 1/2013 | Sardat | .................. | H05K 1/0262 |
| | | | | 361/752 |
| 2016/0094145 A1* | 3/2016 | Oh | .................... | H02M 3/33523 |
| | | | | 363/89 |
| 2016/0352291 A1* | 12/2016 | Chiu | ....................... | H03F 3/085 |
| 2017/0331283 A1* | 11/2017 | Potter | ...................... | H01H 9/40 |
| 2018/0159574 A1* | 6/2018 | Li | ........................ | H04B 1/1615 |
| 2021/0165943 A1* | 6/2021 | Lanes | ................ | G06F 13/4022 |

FOREIGN PATENT DOCUMENTS

| | | | | |
|---|---|---|---|---|
| EP | 2555403 A1 * | 2/2013 | ........ | H02M 3/33523 |
| EP | 3030051 A1 * | 6/2016 | ........ | H05B 33/0845 |
| WO | WO-0225612 A1 * | 3/2002 | ............ | G08B 5/228 |
| WO | WO-2017076342 A1 * | 5/2017 | ............. | G05B 19/04 |

OTHER PUBLICATIONS

TCDT1100(G) Series, Vishay Semiconductors, Optocoupler with Phototransistor Output; pp. 1-9; 1999.

\* cited by examiner

SAFETY DEVICE, VALVE ARRANGEMENT AND METHOD

BACKGROUND OF THE INVENTION

The invention relates to a safety device, in particular to a safety control apparatus and/or to a safety diagnosis apparatus, for industrial automation, comprising a logic voltage zone, a load voltage zone which is galvanically separated from the logic voltage zone, a transmission unit for transmitting a communication signal between the logic voltage zone and the load voltage zone whilst maintaining the galvanic separation, and a first voltage supply connection for providing a first supply voltage for the logic voltage zone.

The load voltage zone in particular serves for the control, in particular the energizing (via current provision), of an actuator, and the logic voltage zone comprises for example a computation unit, in particular a microcontroller which serves for monitoring and/or controlling the load voltage zone and/or the actuator. The safety device for example comprises a module housing, in which the logic voltage zone and the load voltage zone are arranged.

The first voltage supply connection serves for example for the connection of the logic voltage zone onto the first external voltage supply, from which the first supply voltage comes, with which the logic voltage zone is supplied. The first voltage supply connection is designed for example as a plug connector and in particular is arranged on the module housing at the outside.

The load voltage zone can preferably be deactivated independently of the logic voltage zone, for example switched to a voltageless state. The logic voltage zone can continue to be active even given a deactivation of the load voltage zone, so that for example the microcontroller continues to be active. The galvanic separation in particular serves for preventing a voltage which is present in the (active) logic voltage zone from penetrating into the load voltage zone and there effecting an (undesired) activation of a function unit and/or of an actuator.

The transmission unit enables the communication between the logic voltage zone and the load voltage zone. The transmission unit is designed for example as a digital isolator or as an optocoupler.

Conventionally, there is the risk of the transmission unit being able to become damaged, for example by way of too high a current subjection and an overheating which is caused by way of this, and in this case the galvanic separation is lost, so that a voltage from the logic voltage zone can be transmitted into the load voltage zone via the transmission unit, said voltage there effecting an (undesired) activation of the function unit and/or the actuator.

SUMMARY OF THE INVENTION

An object of the invention lies in improving the reliability of the safety device. In particular, an object of the invention lies in rendering the safety device failsafe and/or enabling the fault elimination "short-circuit" between the logic voltage zone and the load voltage zone.

The object is achieved by a safety device for industrial automation, comprising a logic voltage zone, a load voltage zone which is galvanically separated from the logic voltage zone, a transmission unit for transmitting a communication signal between the logic voltage zone and the load voltage zone whilst maintaining the galvanic separation, and a first voltage supply connection for providing a first supply voltage for the logic voltage zone. The safety device comprises a first current limitation element. The transmission unit is connected onto the first voltage supply connection via the first current limitation element and is fed from the first voltage supply connection via the first current limitation element.

In particular, the transmission unit is connected to the voltage supply connection in a direct manner via the first current limitation element. Preferably, it is only the first current limitation unit which is connected between the transmission unit (for example the digital isolator or the optocoupler) and the voltage supply connection.

According to the invention, the transmission unit is connected onto the voltage supply connection of the logic voltage zone and is fed from this connection. Generally, the greatest voltage of the logic voltage zone is present at the voltage supply connection. Consequently, one can assume that in the event of a fault the voltage which is present at the voltage supply connection is not increased compared to a normal operation. Therefore, the first voltage supply, for example 30 V, which is already present at the voltage supply connection in normal operation can be assumed as the worst case, and the current limitation element can be designed with regard to this first supply voltage such that the current which is effected by the first supply voltage and which flows through the transmission unit cannot cause an overheating, in particular cannot cause a defect which could lead to a loss of the galvanic separation.

Conventionally, the transmission unit is connected onto a voltage converter and is fed by this voltage converter. For example, conventionally, the transmission unit is connected onto the same voltage converter with which the computation unit is supplied. The transmission unit in this conventional case is supplied with an electronics supply voltage (e.g. 3.3 V) which is smaller than the first supply voltage and therefore does not represent the highest voltage of the logic voltage zone. Conventionally, it can occur that the electronics supply voltage is increased, for example to the first supply voltage, on account of a defect, e.g. a short-circuit. Since the current limitation element is conventionally designed for the electronics supply voltage, in the case of this defect it can occur that the current of the transmission unit is not adequately limited by the current limitation element and an overheating occurs and, effected by way of this, a loss of the galvanic separation of the transmission unit occurs. This in turn can lead to a short-circuit between the logic voltage zone and the load voltage zone.

Due to the fact that in the present safety device, the transmission unit is connected onto the first voltage supply connection via the first current limitation element and is fed from the voltage supply connection via the first current limitation element, this risk can be reduced or ruled out and the safety can thus be increased by way of this. Preferably, the risk can be ruled out, in particular when an MELF resistor is used as a current limitation element, since normative provisions for the exclusion of the risk/error is ensured due to the MELF construction form. DIN 13894-2 Table D.14 is referred to with regard to this.

In particular, in the present safety device, the transmission unit is not connected to the electronics supply voltage with which the computation unit is supplied.

The invention further relates to a valve arrangement, comprising the safety device and a valve unit which is controlled via the load voltage zone.

The invention further relates to a system, comprising the safety device or the valve arrangement, further comprising a first voltage supply, onto which the first voltage supply connection is connected, and a second voltage supply for providing a/the second supply voltage for the load voltage zone, wherein the second voltage supply comprises a shut-off function, via which the second supply voltage can be shut off whilst maintaining the first supply voltage.

The invention further relates to a method for operating the safety device, the valve arrangement or the system, comprising the step: transmitting the communication signal via the transmission unit.

BRIEF DESCRIPTION OF THE DRAWINGS

Further exemplary details as well as exemplary embodiments are hereinafter explained with reference to the figures. Herein are shown in.

DETAILED DESCRIPTION

Figure 1:
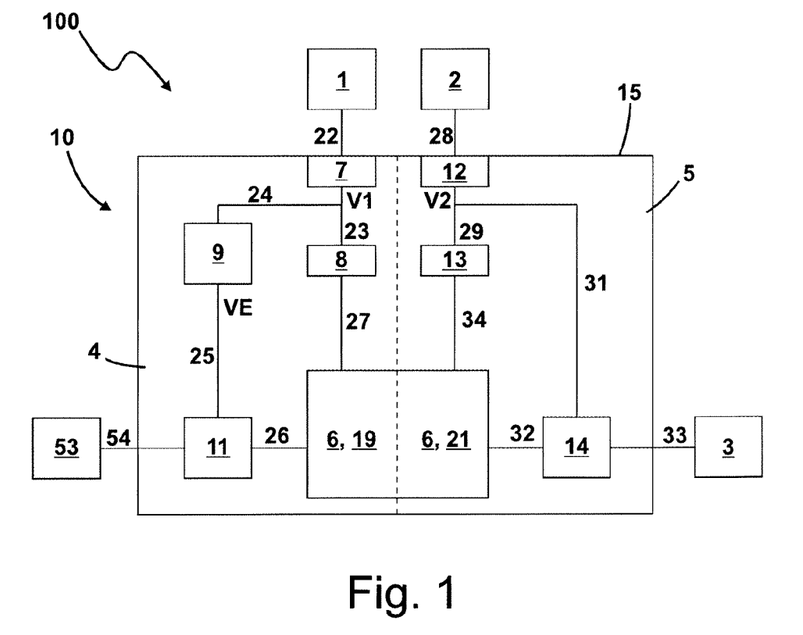
FIG. 1 a schematic representation of a system with a safety device according to a first embodiment, a first voltage supply, a second voltage supply and an actuator, FIG. 2 a schematic representation of a system with a valve arrangement with the safety device, the first voltage supply and the second voltage supply, FIG. 3 a safety device according to a second embodiment, FIG. 4 a safety device according to a third embodiment and FIG. 5 a safety device according to a fourth embodiment.

FIG. 1 shows a system 100 which comprises a first safety device 10, a first voltage supply 1, a second voltage supply 2 and optionally an actuator 3. The system 100 represents an exemplary application environment for the safety device 10. The safety device 10 can also be provided on its own—thus without the voltage supplies 1, 2 and the actuator 3.

Instead of the safety device 10, the subsequently explained safety device 30, 40 or 50 can also be used in the system 100.

The safety device 10 serves for application in industrial automation, in particular in factory automation and/or process automation. The safety device 10 is designed for example as a safety control apparatus, in particular for the control of the actuator 3, and/or as a safety diagnosis apparatus, in particular for the diagnosis of the actuator 3.

The safety device 10 comprises a logic voltage zone 4, and a load voltage zone 5 which is galvanically separated from the logic voltage zone 5. The galvanic separation between the logic voltage zone 4 and the load voltage zone 5 is indicated in FIG. 1 by a dashed line. The logic voltage zone 4 and the load voltage zone 5 are different regions of the safety device 10 which are galvanically separated from one another. No galvanic connection exists between the load voltage zone 5 and the logic voltage zone 4.

The safety device 10 is preferably designed as a module. The safety device 10 in particular comprises a module housing 15 in which the load voltage zone 5 and the logic voltage zone 4 are arranged.

The safety device 10 is preferably used in a module which is not a safety module. The module can be used within a safety application, since it can preferably be guaranteed that the logic voltage zone 4 and the load voltage zone 5 will not be connected—thus that the galvanic separation will be maintained—and given a shut-off of the second supply voltage V2, no voltage will be brought out of the logic voltage zone 4 into the load voltage zone 5.

The safety device 10 further comprises a transmission unit 6 for transmitting a communication signal between the logic voltage zone 4 and the load voltage zone 5 whilst retaining the galvanic separation. The galvanic separation between the logic voltage zone 4 and the load voltage zone 5 therefore continues to exist while transmitting the communication signal. In particular, the transmission unit 6 is a digital isolator. The digital isolator is designed to transmit the communication signal as a digital communication signal across the galvanic separation. The digital isolator internally can comprise for example an optocoupler and/or a capacitive coupling and/or an inductive coupling, in order to transmit the communication signal across the galvanic separation. Alternatively, the transmission unit 6 can be an optocoupler.

The transmission unit 6 expediently comprises a first transmission unit section 19 which is arranged in the logic voltage zone 4 and a second transmission unit section 21 which is arranged in the load voltage zone. The first transmission unit section 19 is galvanically separated from the second transmission unit section 19. The communication signal is transmitted between the first transmission unit section 19 and the second transmission unit section 21.

The safety device 10, in particular the logic voltage zone 4, further comprises a first voltage supply connection 7 for providing a first supply voltage V1 for the logic voltage zone 4. The first voltage supply connection 7 is connected onto the first voltage supply 1, by way of example via a first supply line 22. The first voltage supply 1 is an external voltage supply. The first supply line 22 for example is a first supply cable and runs from the first voltage supply connection 7 to the first voltage supply 1. With regard to the safety device 10, in particular with regard to the module housing 15, the first supply line 22 is an external first supply line. The first supply line 22 is galvanically connected to the logic voltage zone 4. The first supply line 22 transmits the first supply voltage V1 from the first voltage supply 1 to the first voltage supply connection 7. The first voltage supply connection 7 is designed for example as a plug connector, in particular as a plug or a socket. The first voltage supply connection 7 can be arranged for example on the module housing 15, in particular on the module housing 15 at the outside. The first voltage supply connection 7 makes the supply voltage V1 which is fed from the voltage supply 1 available to the logic voltage zone 4. The first supply voltage V1 which is provided by the voltage supply 1 can therefore be tapped at the first voltage supply connection 7. The first supply voltage is for example 18 V to 30 V, preferably 24 V.

The safety device 10, in particular the logic voltage zone 4, comprises a first current limitation element 8 via which the transmission unit 6 is connected onto the first voltage supply connection 7. The transmission unit 6 is fed—thus supplied with electricity—from the first voltage supply connection 7 via the current limitation element 8. The first current limitation element 8 is preferably an ohmic resistor, in particular an MELF resistor. MELF stands for metal electrode leadless faces. The MELF resistor preferably realises a fault exclusion against a short-circuit as per DIN EN ISO 13849-2.

The first current limitation element 8 is galvanically connected to the first voltage supply connection 7. Preferably, the current limitation element 8 is connected to the voltage supply connection 7 in a direct manner, by way of example via a first internal electrical line 23 which in particular runs within the module housing 15. By way of example, the first supply voltage V1 is present at the current limitation element 8. The current limitation element 8 preferably has an ohmic resistance of at least 5 kOhm, at least 7 kOhm, at least 10 kOhm, at least 15 kOhm or at least 20 kOhm. By way of example, the ohmic resistance of the first current limitation element 8 is maximally 10 kOhm or maximally 30 kOhm. By way of example, the ohmic resistance of the first current limitation element 8 is 7.5 kOhm or 20 kOhm.

The logic voltage zone 4 preferably comprises a first voltage converter 9 for converting the first supply voltage V1 into an electronics supply voltage VE. The electronics supply voltage VE by way of example is smaller than 10 V. For example, the electronics supply voltage VE is 3.3 V or 5 V. The first voltage converter 9 is connected to the first voltage supply connection 7, in particular in a direct manner, via a second internal electrical line 24. The first voltage converter 9 is for example a power adaptor.

The logic voltage zone 4 preferably further comprises a computation unit 11, in particular a microcontroller. The computation unit 11 is fed from a first voltage converter 9. The electronics supply voltage VE serves as a supply voltage of the computation unit 11. The computation unit 11 is connected to the first voltage converter 9, in particular in a direct manner, via a third internal electrical line 25. The computation unit 11 is designed to receive the communication signal from the transmission unit 6, in particular from the first transmission unit section 19 and/or to output the communication signal to the transmission unit 6, in particular to the first transmission unit section 19. The computation unit 11 is connected to the transmission unit 6, in particular the first transmission unit section 19, via a fourth electrical line 26.

The computation unit 11 in particular is designed to communicate with an external communication unit 53, for example with an external control unit. By way of example, the system 100 comprises the external communication unit 53 and the computation unit 11 is connected to the external communication unit 53 via an external communication line 54.

The transmission unit 6, in particular the first transmission unit section 19 is connected to the first current limitation element 8, in particular in a direct manner and/or galvanically, via a fifth internal electrical line 27. The transmission unit 6, in particular the first transmission unit section 19 is supplied via the fifth internal electrical line 27 with electrical power for the transmission and/or for the receipt of the communication signal. The transmission unit 6, in particular the first transmission unit section 19, has a first communication connection, to which the computation unit 11 is connected, and a first supply connection, to which the current limitation element 8 is connected.

Preferably, the electrical energy used in the complete logic voltage zone 4 is fed via the first voltage supply connection 7. By way of example, the electrical energy which is used at the first voltage converter 9, the computation unit 11, the current limitation element 8 and/or the first transmission unit section 19 is fed via the first voltage supply connection 7. In particular, the first supply voltage V1 is the highest voltage which is present in the logic voltage zone 4.

The safety device 10, in particular the load voltage zone 5, comprises a second voltage supply connection 12 for providing a second voltage supply V2 for the load voltage zone 5. The second voltage supply connection 12 is galvanically separated from the first voltage supply connection 7. The second voltage supply connection 12 is connected to the second voltage supply 2, for example via a second supply line 28. The second voltage supply 2 is an external voltage supply. The second supply line 28 for example is a second supply cable and runs from the second voltage supply connection 12 to the second voltage supply 2. With regard to the safety device 10, in particular the module housing 15, the second supply line 28 is an external second supply line. The second supply line 28 is galvanically connected to the load voltage zone 5. The second supply line 28 transmits the second supply voltage V2 from the second voltage supply 2 to the second voltage supply connection 12. The second voltage supply connection 12 is designed for example as a plug connector, in particular as a plug or socket. The second voltage supply connection 12 can be arranged for example on the module housing 15, in particular at the outside on the module housing 15, for example separately from the first voltage supply connection 7. The second voltage supply connection 12 makes the second supply voltage V2 which is fed from the voltage supply 2 available to the load voltage zone 5. The second supply voltage V2 which is provided by the second voltage supply V2 can thus be tapped at the second voltage supply connection 12. The second supply voltage is for example 18 V to 30 V, preferably 24 V. The first supply line 22 and the second supply line 28 are galvanically separated from one another.

The safety device 10, in particular the load voltage zone 5, further comprises a second current limitation element 13, via which the transmission unit 6 is connected onto the second voltage supply connection 12 and via which the transmission unit 6 is fed from the second voltage supply connection 12. The second current limitation element 13 is an ohmic resistor, in particular a MELF resistor. The MELF resistor preferably realises a fault exclusion against a short-circuit as per DIN EN ISO 13849-2.

The second current limitation element 13 is galvanically connected to the second voltage supply connection 12. The second current limitation element 13 is preferably connected to the second voltage supply connection 12 in a direct manner, by way of example via a sixth internal electrical a line 29 which in particular runs within the module housing 15. By way of example, the second supply voltage V2 is present at the second current limitation element 13. The second current limitation element 13 preferably comprises an ohmic resistance of at least 5 kOhm, at least 7 kOhm, at least 10 kOhm, at least 15 kOhm or at least 20 kOhm. By way of example, the ohmic resistance of the second current limitation element 13 is maximally 10 kOhm or maximally 30 kOhm. By way of example, the ohmic resistance of the second current limitation element 13 is 10 kOhm or 20 kOhm.

By way of example, the load voltage zone 5 comprises a function unit 14 which is designed to receive the communication signal from the transmission unit 6, in particular from the second transmission unit section 21 and/or to output the communication signal onto the transmission unit 6, in particular onto the second transmission unit section 21. The function unit 14 is fed from the second voltage supply connection 12, in particular in a direct manner The second supply voltage V2 serves as a supply voltage of the function unit 14. The function unit 14 is connected to the second voltage supply connection 12, in particular in a direct manner, via a seventh internal electrical line 31. The function unit 14 is connected to the transmission unit 6, in particular to the second transmission unit section 21, in particular in a direct manner, via an eighth internal electrical line 32.

The functional unit 14 in particular is designed as a control unit, for example as a driver unit, and in particular serves for the control of the actuator 3. The function unit 14 is connected to the actuator 3 for example via an electrical actuator line 33 and controls the actuator 3 with an control signal via the electrical actuator line 33, in order to effect the actuator 3 into carrying out an action, in particular a movement. The function unit 14 carries out the control of the actuator 3 in particular according to the communication signal which is transmitted via the transmission unit 6. The communication signal comprises for example a control command for the control of the actuator 3. The electrical energy for the control signal is fed in particular via the second voltage supply connection 12. The actuator 3 is preferably supplied with energy via the control signal.

Furthermore, the function unit 14 can be designed to receive a state signal from the actuator 3 via the actuator line 22 and to transmit, in accordance with the state signal, the communication signal to the computation unit 11 via the transmission unit 6. The communication signal comprises for example state information which is contained in the state signal.

The actuator 3 is preferably a valve unit. A switching of the valve unit is preferably effected via the control signal. The communication signal expediently specifies a switching position for the valve unit.

The transmission unit 6, in particular the second transmission unit section 21, is connected to the second current limitation element 13, in particular in a direct and/or galvanic manner, via a ninth internal electrical line 34. The transmission unit 6, in particular the second transmission unit section 21, is supplied via the ninth internal electrical line 34 with electrical power for the transmission and/or receipt of the communication signal. The transmission unit 6, in particular the second transmission unit section 21, has a second communication connection, to which the function unit 14 is connected, and a second supply connection, to which the second current limitation element 13 is connected.

Preferably, the electrical energy used in the complete load voltage zone 5 is fed via the second voltage supply connection 12. By way of example, the electrical energy which is used at the function unit 14, the second current limitation element 13 and/or the second transmission unit section 21 is fed via the second voltage supply connection 12. In particular, the second supply voltage V2 is the highest voltage which is present in the load voltage zone 5.

Preferably, the second voltage supply 2 has a shut-off function, via which the second supply voltage V2 can be shut-off whilst maintaining the first supply voltage V1. In particular, the load voltage zone 5 can be switched to a voltageless state without switching the logic voltage zone 4 to a voltageless state. In particular, given a deactivated load voltage zone 5, the logic voltage zone 4, in particular the computation unit 11, can continue to remain active. By way of the galvanic separation between the load voltage zone 5 and the logic voltage zone 4, it is ensured that given a deactivated—thus in particular voltageless—load voltage zone 5, no (undesirable) activation of the load voltage zone 5, in particular of the function unit 14 and/or of the actuator 3, can be effected via the logic voltage zone 4. In particular, by way of the galvanic separation, one prevents a voltage of the logic voltage zone 4 from being transmitted into the load voltage zone and by way of this effecting an activation and/or actuation of the function unit 14 and/or of the actuator 3.

The maintenance of the galvanic separation in particular is failsafe. Expediently, it can be guaranteed that the galvanic separation is not lifted in designated operation of the safety device 10, in particular within defined constraints. In particular, for the safety device 10, a guaranteed maintenance of the galvanic separation in the event of a fault is given.

Preferably, the transmission unit 6, the first current limitation element 8, the first voltage converter 9 and/or the computation unit 11 is arranged in the module housing 15. Expediently, the second current limitation element 13 and/or the function unit 14 is arranged in the module housing 15.

In particular, the safety device 10 is designed as a safety control device. The computation unit 11 computes a control command for the control of the actuator 3 and outputs the communication signal which contains the control command to the transmission unit 6. The transmission unit 6 transmits the communication signal from the logic voltage zone 4 into the load voltage zone 5 and outputs the communication signal to the function unit 14. The function unit 14 controls the actuator 3 according to the control command which is contained in the communication signal. The second voltage supply 2 carries out a shut-off of the load voltage zone, in particular in response to an emergency. For example, the second voltage supply 2 sets the second supply voltage V2 to zero. The logic voltage zone 4, in particular the computation unit 11, continues to be supplied with voltage. The computation unit 11 by way of example also communicates with the external communication unit 53, for example an external control unit, even in the case of a shut-off load voltage zone 5.

The communication signal is preferably a switching signal, for example a binary signal.

The safety device 10 is expediently designed as a safety diagnosis apparatus. The function unit 14 generates state information and outputs the communication signal which contains the state information to the transmission unit 6. The transmission unit 6 transmits the communication signal from the load voltage zone 5 into the logic voltage zone 4 and outputs the communication signal to the computation unit 11. The computation unit 11 processes the state information which is contained in the communication signal. The second voltage supply 2 carries out a shut-off of the load voltage zone, in particular in response to an emergency. For example, the second voltage supply 2 sets the second supply voltage V2 to zero. The logic voltage zone 4, in particular the computation unit 11 continues to be supplied with voltage. The computation unit 11 for example communicates with the external communication unit, for example an external control unit, even given a shut-off load voltage zone 5.

The safety device 10 preferably realises a fault exclusion as per DIN EN ISO 13849-2, in particular against a short-circuit between the logic voltage zone 4 and the load voltage zone 5, preferably without a restriction of the safety category. Preferably all outputs, in particular the load voltage zone 5, can be shut-off in a safety-oriented manner.

The transmission unit 6, which in particular is designed as an optocoupler, is preferably constructed in accordance with the overvoltage category III according to IEC 60664-1.

By way of feeding the transmission unit 6 from the voltage supply connection 7 via the first current limitation element 8, the power of the transmission unit 6 is limited for example to less than 400 mW.

Figure 2:
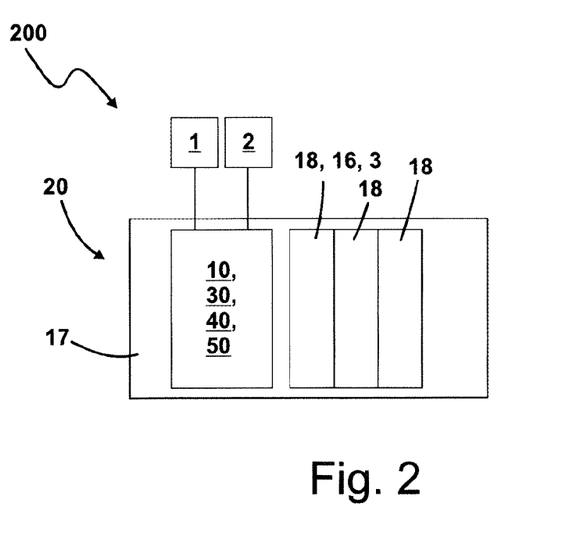

FIG. 2 shows a system 200 which comprises a valve arrangement 20, the first voltage supply 1 and the second voltage supply 2. The system 200 is an exemplary application environment of the valve arrangement 20. The valve arrangement 20 can also be provided on its own—thus in particular without the first voltage supply 1 and the second voltage supply 2. The valve arrangement 20 by way of example is designed as a valve terminal.

The valve arrangement 20 comprises the safety device 10. The valve arrangement 20 further comprises a valve unit 16 which is controlled via the load voltage zone. The valve unit 16 is an example for the actuator 3. By way of example, the valve arrangement 20 comprises a carrier section 17, on which a plurality of valve modules 18 are arranged next to one another. The carrier section 17 for example is a carrier plate. One of the valve modules 18 comprises the valve unit 16. The safety device 10 by way of example is designed as a module and in particular is arranged on the carrier section 17, by way of example next to the valve modules 18. As the safety device, it is also possible to use the safety device 30, 40 or 50 which is described hereinafter.

Figure 3:
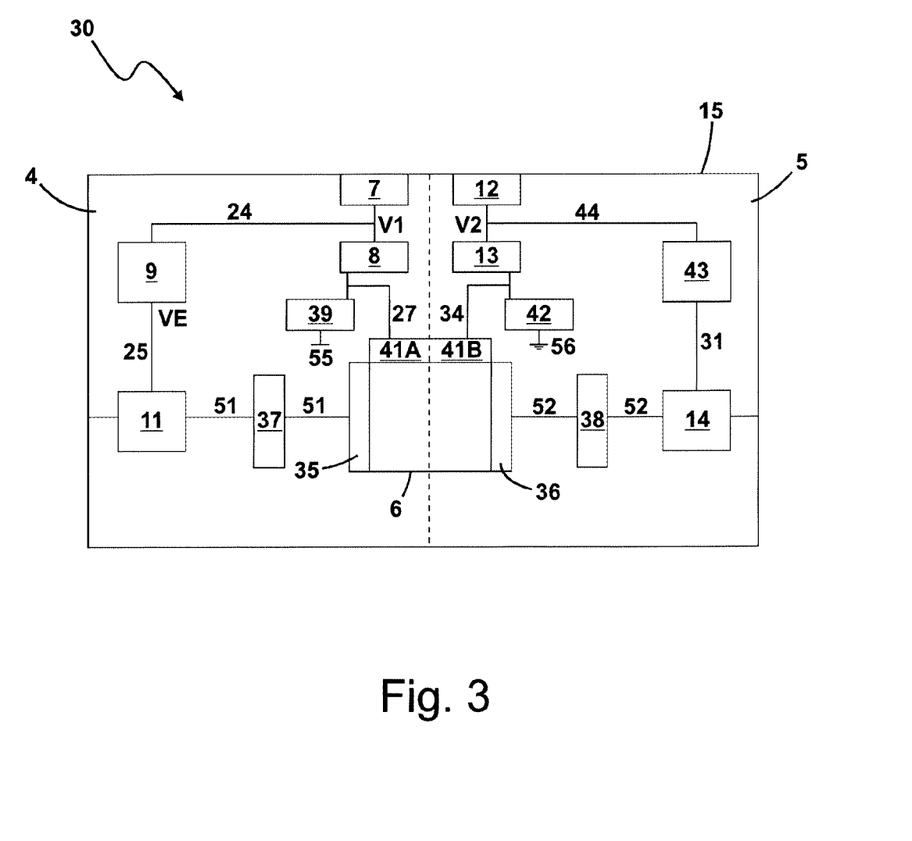

FIG. 3 shows a safety device 30 according to a second embodiment. The explanations which relate to the safety device 10 preferably also apply to the safety device 30.

In the safety device 30, the transmission unit 6 in particular is designed as a digital isolator. The transmission unit 6, in particular the digital isolator, is designed as a chip. For example, the transmission unit 6 is a digital isolator, in particular a multichannel digital isolator, for example a four-channel digital isolator. By way of example, the transmission unit 6 is the digital isolator ISO7041 by Texas Instruments.

The transmission unit 6 has a first bus interface 35 which belongs to the logic voltage zone 4 and a second bus interface 36 which belongs to the load voltage zone 5. The first bus interface 35 and/or the second bus interface 36 in particular are interfaces for a synchronous serial data bus, for example for an SPI. SPI stands for serial peripheral interface. A first signal path 51, for example a bus line, runs between the computation unit 11 and the first bus interface 35. The communication signal is transmitted between the computation unit 11 and the transmission unit 6 via the first signal path 51. The first signal path 51 by way of example comprises a plurality of signal lines which in particular run parallel next to one another. A second signal path 52, for example a bus line, runs between the function unit 14 and the second bus interface 36. The communication signal is transmitted between the function unit 4 and the transmission unit 6 via the second signal path 52. The second signal path 52 by way of example comprises a plurality of signal lines which in particular run parallel to one another.

The logic voltage zone 4 of the safety device 30 comprises a first current limitation arrangement 37, via which the first signal path 51 runs. The first current limitation arrangement 37 limits the electrical current of the first signal path 51. The first current limitation arrangement 37 comprises one or more ohmic resistors, in particular one or more MELF resistors.

The load voltage zone 5 of the safety device 30 comprises a second current limitation arrangement 38, via which the second signal path 52 runs. The second current limitation arrangement 38 limits the electrical current of the second signal path 52. The second current limitation arrangement 38 comprises one or more ohmic resistors, in particular one or more MELF resistors.

The logic voltage zone 4 further comprises a first reference diode 39. The first current limitation element 8 is connected between the first reference diode 39 and the voltage supply connection 7. The first reference diode 39 serves for limiting the voltage which is present at the transmission unit 6, in particular the voltage of the fifth internal electrical line 27, to a first transmission unit supply voltage. The first reference diode 39 is connected between the fifth internal electrical line 27 and a first ground 55. The first ground 55 can be denoted as a logic-side ground. The first transmission unit supply voltage in particular is smaller than 10 V and is for example 3.3 V or 5 V. The first transmission unit supply voltage is fed to a first supply section 41A of the transmission unit 6. The first supply section 41A can also be denoted as a logic-side supply section.

Preferably, the first current limitation element 8 is connected directly to the first voltage supply connection 7 and/or the transmission unit 6 which in particular is designed as a chip is connected directly to the current limitation element 8.

The load voltage zone 5 further comprises a second reference diode 42. The second current limitation element 13 is connected between the second reference diode 42 and the second voltage supply connection 12. The second reference diode 42 serves for limiting the voltage which is present at the transmission unit 6, in particular the voltage of the ninth internal electrical line 34, to a second transmission unit supply voltage. The second reference diode 42 is connected between the ninth internal electrical line 34 and a second ground 56. The second ground 56 can also be denoted as a load-side ground. The second ground 56 is galvanically separated from the first ground 55, in particular from the first supply voltage V1. The second transmission unit supply voltage in particular is smaller than 10 V and is for example 3.3 V or 5 V. The second transmission unit supply voltage is fed to a second supply section 41B of the transmission unit 6. The second supply section 41B can also be denoted as a load-side supply section. The second supply section 41B is galvanically separated from the first supply section 41A.

The load voltage zone 5 by way of example further comprises a second voltage converter 43 for converting the second supply voltage V2 into a function unit supply voltage, with which the function unit 14 is supplied. The function unit supply voltage by way of example is smaller than 10 V. For example, the function unit supply voltage is 3.3 V or 5 V. The second voltage converter 43 is connected via a tenth internal electrical line 44 to the second voltage supply connection 12, in particular in a direct manner. The function unit 14 is connected to the second voltage converter 43 via the seventh internal electrical line 31. The second voltage transformer 43 for example is a power adaptor.

The current limitation elements 8, 13 and the current limitation arrangements 37 and 38 represent a failsafe circuiting which protects the transmission unit 6 from too high a current and thus in particular from a defect. By way of example, all connections of the transmission unit 6 are secured via the failsafe circuiting.

The voltage converters 9, 43, the computation unit 11 and/or the function unit 14 by way of example are unprotected and can be subjected to too high a current and/or too high a voltage and become damaged on account of this, without the galvanic separation being compromised due to this.

In particular, the function unit 14 is designed as a periphery unit. For example, the function unit 14 is an analog to digital converter, a sensor, a valve driver or a microcontroller.

The supply of the digital isolator is effected by way of example in a direct manner via the first current limitation element 8 directly from the first supply voltage V1, by way of example buffered 24 V, which is fed externally. An individual voltage zone for the digital isolator is produced with the help of the first reference diode 39. By way of this, it is possible to select the first current limitation element 8 with a high resistance (e.g. 20 kOhm).

A "normal" supply of the digital isolator from the electronics supply voltage VE, for example from 3.3 V or 5 V, would be difficult, since in normal operation enough current must be provided for the digital isolator (resistance must be low) but in the event of a fault the current must be adequately limited (resistance must be large).

Due to the fact that an individual voltage zone is present for the digital isolator, the circuit, in particular the first current limitation element, can be designed directly for a maximal voltage supply V1 of for example 30 V, by which means the high-resistance first current limitation element 8 becomes possible. The reference diodes 39, 42 are applied in order to keep the supply voltage for the digital isolator in the correct region. Herewith, sufficient current and the correct voltage can be made available to the isolator in normal operation. And in the event of a fault, the current is limited to a sufficient extent.

The signal paths 51, 52 are preferably also secured. Power could also be brought into the digital isolator via these signal paths 51, 52 (without the securing). By way of example, the current limitation arrangements 37, 38 comprise MELF resistors of 20 kOhm or less. Each current limitation arrangement 37, 38 comprises several MELF resistors. Preferably, an individual MELF resistor is provided for each signal line of the signal paths 51, 52.

Figure 4:
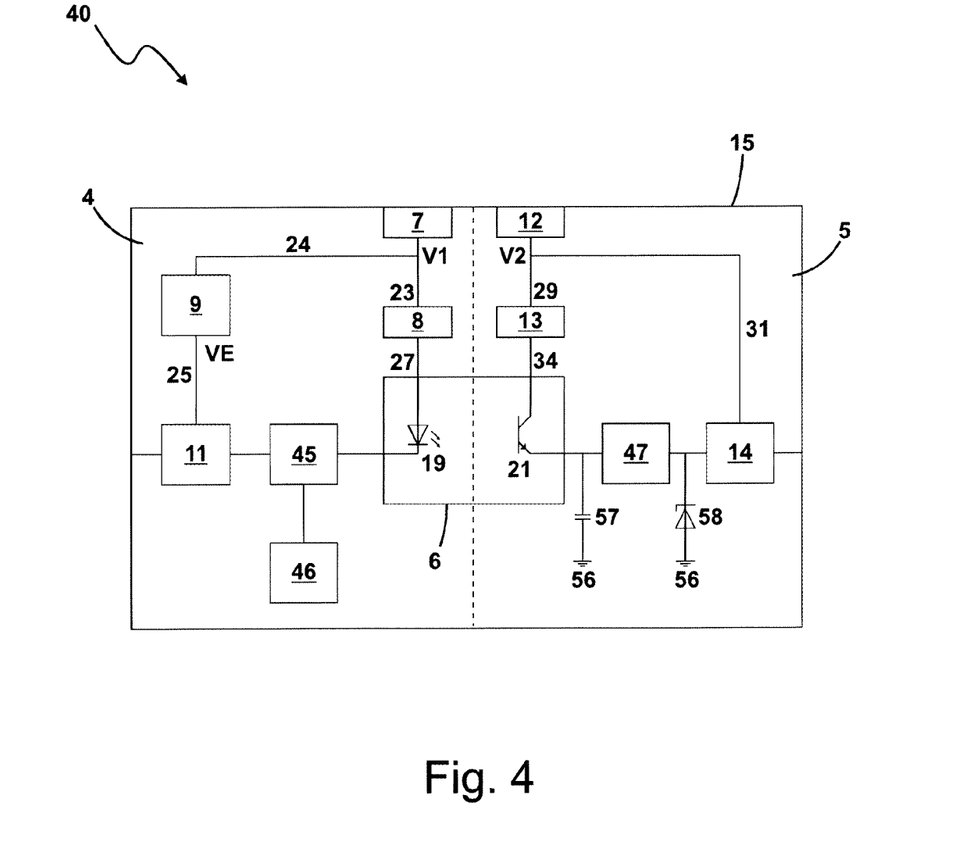

FIG. 4 shows a safety device 40 according to a third embodiment. The explanations which relate to the safety device 10 preferably also apply to the safety device 40.

In the safety device 40, the transmission unit 6 is designed as an optocoupler. The first transmission unit section 19 by way of example is designed as an optical transmitter, for example as a light diode or laser diode. The first transmission unit section 19 is supplied with current via the first current limitation element 8. The second transmission unit section 21 by way of example is designed as an optical receiver, for example as a photodiode or as a phototransistor. The second transmission unit section 21 is supplied with current via the second current limitation element 13.

The logic voltage zone 4 by way of example comprises a transistor 45, for example a bipolar transistor, in particular an npn transistor. The computation unit 11 controls the first transmission unit section 19 via the transistor 45 and, by way of this, transmits the communication signal to the transmission unit 6. By way of example, the collector of the transistor 45 is connected to the cathode of the first transmission unit section 19, and/or the base of the transistor 45 is connected to the computation unit 11. The computation unit 11 outputs, as the communication signal, in particular a 3.3 V control signal to the base of the transistor 45. The logic voltage zone 4 by way of example further comprises a constant current sink 46 which in particular is connected to the emitter of the transistor 45.

The load voltage zone 5 further comprises a current limitation unit 47 which is connected between the second transmission unit section 21 and the function unit 14.

The function unit 14 by way of example is a highside switch or a valve driver and serves for example for controlling an external actuator, for example the actuator 3.

The current limitation elements 8, 13 represent a failsafe circuiting, which protects the transmission unit 6 from too high a current and/or too high a power—and hence in particular from a defect. In particular, the current limitation elements 8, 13 ensure that the current and/or the power do not become unallowably large in the event of a fault.

The voltage converter 9, the computation unit 11, the transistor 45, the constant current sink 46, the function unit 14 and/or the current limitation unit 47 by way of example are unprotected and thus can be subjected to too high a current and/or too high a voltage and become damaged by way of this, without the galvanic separation becoming compromised.

Optionally, the computation unit 11 is designed to output the communication signal as a PWM signal, for example with a frequency of greater than 100 kHz. In particular, the communication signal is transmitted as a pulsed communication signal by the transmission unit 6 across the galvanic separation. By way of this, in particular the transmission unit 6, for example the optocoupler, is brought into a pulsed operation. In this manner, the power loss of the transmission unit 6 can be reduced. By way of example, the frequency of the PWM signal is 200 kHz. The duty cycle of the PWM signal is maximally 30%, by way of example the duty cycle is 20%. In this variant, expediently a resistor, for example of 1 kOhm, is connected onto the emitter of the transistor 45. The load voltage zone 5 expediently further has a capacitor 57 which is connected between the output of the second transmission unit section 21 and the second ground 56. The capacitor 57 serves for buffering the communication signal which is outputted to the second transmission unit section 21. The capacitor 57 smoothes the communication signal. The optocoupler, in particular the second transmission unit section 21 which is designed as a receiving transistor, is clocked by way of the PWM control, and by way of this produces a clocked signal. The capacitor 57 is there to again obtain a smooth digital signal. The current limitation element 47 in particular is a series resistor which slows down the discharge of the capacitor 57. The function unit 14 preferably has a high-impedance input of for example at least 10 kOhm.

Optionally a Z-diode 58 is present, which by way of example is connected between the output of the current limitation element 47 and the second ground 56.

The dissipated power of the first transmission unit section 19 is (for a first supply voltage V1 of 30 V) less than 30 mW, in particular less than 20 mW. The power dissipation of the second transmission unit section 21 (for a second supply voltage V2 of 30 V) is less than 30 mW, in particular less than 20 mW.

The optocoupler is therefore supplied directly from the externally fed first supply voltage V1, for example of 24 V, via the first current limitation element 8. By way of this, the first current limitation element 8 can be selected large, for example several kOhm large, by way of example 7.5 kOhm large. Consequently, in normal operation, sufficient current for the first transmission unit section 19, for example the LED, can be supplied via the first current limitation element 8, and in the event of a fault the first current limitation element 8 can sufficiently limit the current through the first transmission unit section 19, so that the galvanic separation is not compromised. The first transmission unit section 19 is not connected to a microcontroller pin (of the computation unit 11) in a direct manner, but is activated via the transistor 45. A Z-diode can be present at the output of the second transmission unit section 21, in order to limit the voltage which is present there.

Figure 5:
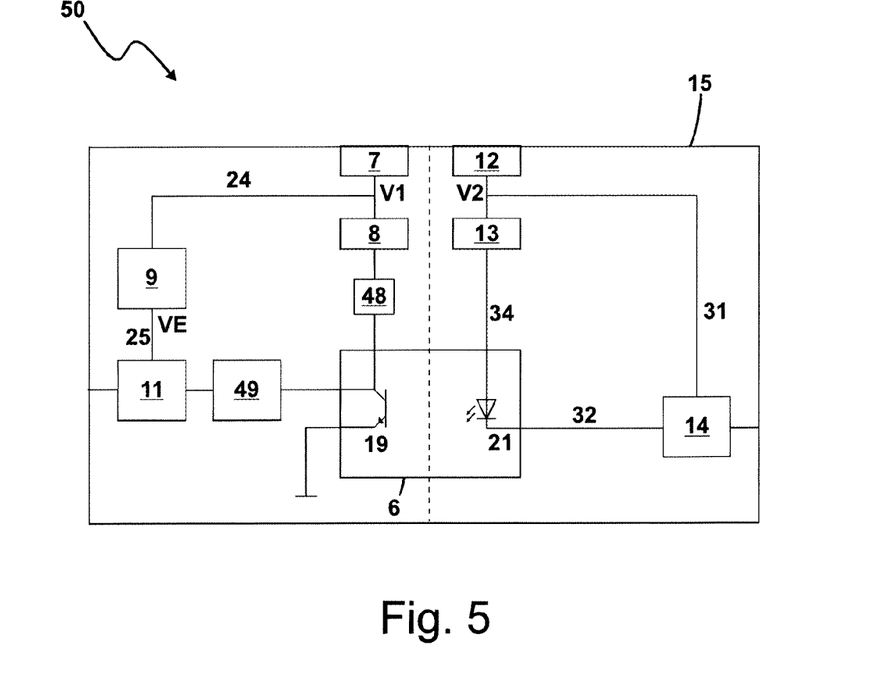

FIG. 5 shows a safety device 50 according to a fourth embodiment. The explanations which relates to the safety device 10 preferably also apply to the safety device 50.

In the safety device 50, the transmission unit 6 is designed as an optocoupler. The first transmission unit section 19 by way of example is designed as an optical receiver, for example as a photodiode or as a phototransistor. The first transmission unit section 19 is supplied with current via the first current limitation element 8. The second transmission unit section 21 by way of example is designed as an optical emitter, for example as a light diode or laser diode. The section transmission unit section 21 is supplied with current via the second current limitation element 13.

The logic voltage zone 4 by way of example comprises a pull-up resistor 48, via which the first transmission unit section 19, in particular its output, is connected to the first current limitation element 8. The output of the first transmission unit section 19 is connected to the computation unit 11, by way of example via a current limitation unit 49.

The function unit 14 by way of example is an open drain diagnosis pin driver, a highside switch or a valve driver.

The current limitation elements 8, 13 represent a failsafe circuiting which protects the transmission unit 6 from too high a current and/or too high a power—and therefore in particular from a fault. In particular, the current limitation elements 8, 13 in the event of a fault ensure that the current and/or the power do not become unallowably high.

The voltage converter 9, the computation unit 11, the pull-up resistor 48, the current limitation unit 49 and/or the function unit 14 by way of example are unprotected and can be subjected to too high a current and/or too high a voltage and thereby become damaged, without the galvanic separation being thereby compromised.

What is claimed is:

1. A safety device for industrial automation, comprising a logic voltage zone, a load voltage zone, which is galvanically separated from the logic voltage zone, a transmission unit for transmitting a communication signal between the logic voltage zone and the load voltage zone whilst maintaining the galvanic separation, a first voltage supply connection for providing a first supply voltage for the logic voltage zone, and a first current limitation element, wherein the transmission unit is connected to the first voltage supply connection via the first current limitation element and is fed from the first voltage supply connection via the first current limitation element, and
    wherein the logic voltage zone comprises a voltage converter for converting the supply voltage into an electronics supply voltage, as well as a computation unit which is fed from the electronics supply voltage and is designed to receive and/or output the communication signal.

2. The safety device according to claim 1, wherein the safety device is a safety control apparatus and/or a safety diagnosis apparatus.

3. The safety device according to claim 1, wherein the first supply voltage is the highest voltage which is present in the logic voltage zone.

4. The safety device according to claim 1, wherein first voltage supply connection serves for the connection of the safety device to a first external voltage supply.

5. The safety device according to claim 1, further comprising a second voltage supply connection for providing a second supply voltage for the load voltage zone, and a second current limitation element, wherein the transmission unit is connected to the second voltage supply connection via the second current limitation element and is fed from the second voltage supply connection via the second current limitation element.

6. The safety device according to claim 1, wherein the second voltage supply connection serves for the connection of the safety device to a second external voltage supply.

7. The safety device according to claim 1, wherein the first current limitation element and/or a second current limitation element are each designed as a resistor.

8. The safety device according to claim 7, wherein the first current limitation element and/or the second current limitation element are each designed as a MELF resistor.

9. The safety device according to claim 1, wherein the transmission unit comprises an optocoupler.

10. The safety device according to claim 1, wherein the transmission unit comprises a digital isolator.

11. The safety device according to claim 1, wherein the load voltage zone comprises a function unit which is designed to receive and/or output the communication signal.

12. The safety device according to claim 1, designed as a module with a module housing in which the logic voltage zone and the load voltage zone are arranged.

13. The safety device according to claim 1, wherein the communication signal is a PWM signal.

14. A valve arrangement, comprising a safety device for industrial automation, the safety device comprising a logic voltage zone, a load voltage zone which is galvanically separated from the logic voltage zone, a transmission unit for transmitting a communication signal between the logic voltage zone and the load voltage zone whilst maintaining the galvanic separation, a first voltage supply connection for providing a first supply voltage for the logic voltage zone, and a first current limitation element, wherein the transmission unit is connected to the first voltage supply connection via the first current limitation element and is fed from the first voltage supply connection via the first current limitation element, the valve arrangement further comprising a valve unit which is controlled via the load voltage zone.

15. The valve arrangement according to claim 14, comprising a carrier section on which a plurality of valve modules are arranged next to one another, wherein one of the valve modules comprises the valve unit.

16. A system, comprising a safety device for industrial automation, the safety device comprising a logic voltage zone, a load voltage zone which is galvanically separated from the logic voltage zone, a transmission unit for transmitting a communication signal between the logic voltage zone and the load voltage zone whilst maintaining the galvanic separation, a first voltage supply connection for providing a first supply voltage for the logic voltage zone, and a first current limitation element, wherein the transmission unit is connected to the first voltage supply connection via the first current limitation element and is fed from the first voltage supply connection via the first current limitation element, the system further comprising a first voltage supply to which the first voltage supply connection is connected, and a second voltage supply for providing a second supply voltage for the load voltage zone, wherein the second voltage supply has a shut-off function for shutting off the second supply voltage whilst maintaining the first supply voltage.

17. A method for operating a safety device for industrial automation, the safety device comprising a logic voltage zone, a load voltage zone which is galvanically separated from the logic voltage zone, a transmission unit for transmitting a communication signal between the logic voltage zone and the load voltage zone whilst maintaining the galvanic separation, a first voltage supply connection for providing a first supply voltage for the logic voltage zone, and a first current limitation element, wherein the transmission unit is connected to the first voltage supply connection via the first current limitation element and is fed from the first voltage supply connection via the first current limitation element, the method comprising the step: transmitting the communication signal via the transmission unit,
    wherein the communication signal is a PWM signal.

* * * * *